United States Patent
Kamath et al.

(10) Patent No.: US 9,935,763 B2
(45) Date of Patent: Apr. 3, 2018

(54) TIMING CORRECTION IN A COMMUNICATION SYSTEM

(71) Applicant: Texas Instruments Incorporated, Dallas, TX (US)

(72) Inventors: Anant Shankar Kamath, Plano, TX (US); Divyasree J., Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/483,408

(22) Filed: Apr. 10, 2017

(65) Prior Publication Data
US 2017/0366332 A1    Dec. 21, 2017

Related U.S. Application Data

(60) Provisional application No. 62/351,592, filed on Jun. 17, 2016.

(51) Int. Cl.
*H04B 1/10*    (2006.01)
*H04L 7/00*    (2006.01)

(52) U.S. Cl.
CPC .......... *H04L 7/0087* (2013.01); *H04L 7/0037* (2013.01)

(58) Field of Classification Search
CPC .. H04L 25/085; H03K 5/1252; H04B 10/802; H04B 1/48; H02M 3/33553; H02M 1/14; H02M 1/44; G05F 1/462; Y10T 29/41
See application file for complete search history.

(56) References Cited

U.S. PATENT DOCUMENTS

| | | | | |
|---|---|---|---|---|
| 4,835,486 A * | 5/1989 | Somerville | ............... | H03F 3/38 327/335 |
| 4,881,041 A * | 11/1989 | Kawanabe | ............. | H03K 3/017 327/167 |
| 6,201,916 B1 * | 3/2001 | Eggleton | .......... | H04B 10/25077 385/122 |
| 6,253,265 B1 * | 6/2001 | Schwan | .............. | G06F 13/4068 710/100 |
| 6,351,501 B1 * | 2/2002 | Murdock | ................ | H03M 7/14 341/59 |
| 8,693,528 B1 * | 4/2014 | Shrestha | ............. | H04L 25/0276 375/219 |
| 9,621,383 B1 * | 4/2017 | Urienza | ................ | H04L 25/085 |
| 2008/0062590 A1 * | 3/2008 | Karam | .................... | H04L 12/10 361/42 |

(Continued)

FOREIGN PATENT DOCUMENTS

CN    105549487    4/2016

OTHER PUBLICATIONS

International Search Report in corresponding PCT Application No. PCT/US2017/038183, dated Sep. 21, 2017 (2 pages).

*Primary Examiner* — Khanh C Tran
(74) *Attorney, Agent, or Firm* — John R. Pessetto; Charles A. Brill; Frank D. Cimino

(57) ABSTRACT

One example includes a communication system. The system includes a data transmitter configured to generate a digital communication signal and a data receiver configured to receive the digital communication signal. The system also includes a pulse-width distortion (PWD) correction circuit arranged between the data transmitter and the data receiver and being configured to adjust at least one timing parameter associated with the communication signal.

15 Claims, 5 Drawing Sheets

(56) References Cited

U.S. PATENT DOCUMENTS

2014/0169038 A1    6/2014  Kamath et al.
2014/0328427 A1* 11/2014  Chang ..................... H04L 27/10
                                                          375/271

* cited by examiner

TIMING CORRECTION IN A COMMUNICATION SYSTEM

RELATED APPLICATION

This application claims priority from U.S. Provisional Patent Application No. 62/351,592, filed 17 Jun. 2016, and entitled TIMING PARAMETER INVOLVEMENT IN DIGITAL ISOLATORS, which is incorporated herein by reference in its entirety.

TECHNICAL FIELD

This disclosure relates generally to electronic systems, and more specifically to timing correction in a communication system.

BACKGROUND

Digital communication is implemented in a large variety of communication systems in which data is transmitted based on having logic-high and logic-low states associated with respective voltage amplitudes. Some digital data transfer is implemented across isolation barriers, such that digital communication can occur across a high-voltage isolation element (e.g., as a capacitor or a transformer). The two sides of a digital isolator are referenced to ground potentials that can be thousands of volts apart. As an example, an isolation barrier can be implemented for single-ended or differential peripheral input/output circuits that receive data to the isolator or transmit data from the isolator. Digital isolators are one example of different sources of timing degradation, such as jitter or pulse-width distortion, that can occur in digital communication systems. Such timing degradation can lead to errors in the data that is transmitted from a data transmitter to a data receiver.

SUMMARY

One example includes a communication system. The system includes a data transmitter configured to generate a digital communication signal and a data receiver configured to receive the digital communication signal. The system also includes a pulse-width distortion (PWD) correction circuit arranged between the data transmitter and the data receiver and being configured to adjust at least one timing parameter associated with the communication signal.

Another example includes a method for correcting pulse-width distortion in an isolated communication system. The method includes receiving a digital communication signal from an isolation barrier and filtering the digital communication signal to generate an average voltage corresponding to an average voltage amplitude of the digital communication signal. The method also includes comparing the average voltage with a predetermined reference voltage. The method further includes delaying at least one of a rising-edge and a falling-edge of the digital communication signal based on the comparison.

Another example includes an isolator circuit interconnecting a data transmitter and a data receiver. The isolator circuit includes an isolation barrier configured to provide isolation of a DC-balanced digital communication signal that is transmitted from the data transmitter to the data receiver. The isolator circuit also includes a PWD correction circuit arranged downstream of the isolation barrier and being configured to adjust at least one timing parameter associated with the DC-balanced digital communication signal.

DETAILED DESCRIPTION

This disclosure relates generally to electronic systems, and more specifically to timing correction in a communication system. A communication system, which includes a data transmitter that transmits a digital communication signal to a data receiver, can include a pulse-width distortion (PWD) correction circuit. The PWD correction circuit can be configured to adjust at least one timing parameter associated with the digital communication signal to mitigate PWD of the digital communication signal with respect to the data receiver. As an example, the PWD correction circuit can be arranged in an isolator circuit that includes an isolation barrier across which the digital communication signal is transmitted, and via which PWD can be introduced in the digital communication signal. For instance, the PWD correction circuit can be arranged downstream of the isolation barrier in the signal path of the digital communication signal in the isolator circuit. Accordingly, the PWD correction circuit can be configured to detect and substantially correct PWD in the digital communication signal.

As an example, the PWD correction circuit can be configured to delay at least one of a rising-edge and a falling-edge of the digital communication signal. For example, the PWD correction circuit can include at least one of a falling-edge delay circuit and a rising-edge delay circuit. Each of the falling-edge and rising-edge delay circuits can include a data buffer that includes an inverter stage and a second stage that are both arranged as inverters to provide a buffered digital communication signal. The buffered digital communication signal can be filtered (e.g., via an RC filter) to provide an average voltage that corresponds to an average amplitude of the buffered digital communication signal. An error amplifier can compare the average voltage with a predetermined reference voltage that can correspond to an average of the logic-states (e.g., approximately half the voltage amplitude of the logic-high state) of the buffered digital communication signal. The error amplifier can generate a comparison signal based on the comparison. The comparison signal can control a delay transistor that is arranged between one of the inverting pair transistors of the inverter stage, such that the rising-edge or falling-edge, respectively, of the digital communication signal is delayed in the buffered digital communication signal. Accordingly, the PWD correction circuit can mitigate pulse-width distortion.

Figure 1:
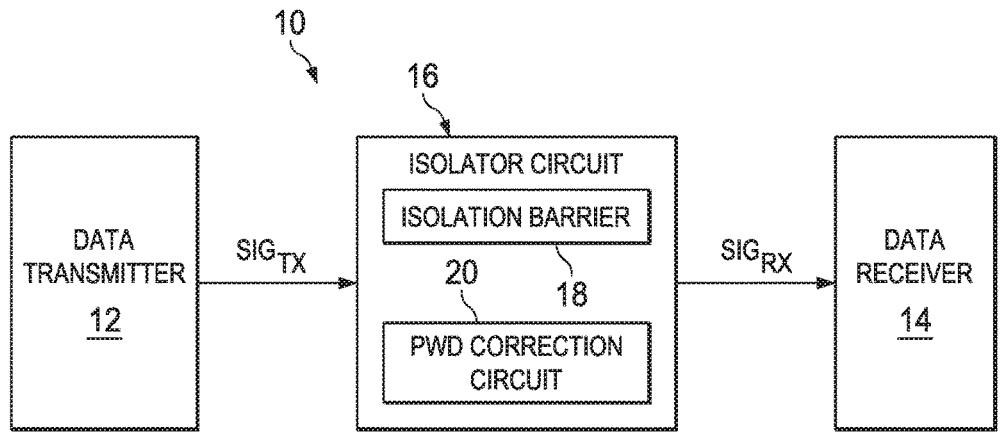
FIG. 1 illustrates an example of an isolated communication system.

FIG. 1 illustrates an example of an isolated communication system 10. The isolated communication system 10 can be implemented in any of a variety of digital communication systems, such as a digital communication system in which isolation is necessary. The isolated communication system 10 includes a data transmitter 12 configured to transmit a digital communication signal, demonstrated in the example of FIG. 1 as a signal $SIG_{TX}$. The isolated communication system 10 also includes a data receiver 14 that receives the digital communication signal as a signal $SIG_{RX}$. The isolated communication system 10 further includes an isolator circuit 16 that is configured to provide isolation of the digital communication signal, such that the isolator circuit 16 receives the digital communication signal $SIG_{TX}$ and generates the digital communication signal $SIG_{TX}$. The isolator circuit 16 includes an isolation barrier 18 that is configured to provide the isolation of the digital communication signal. For example, the isolation barrier 18 can be configured as a transformer, a capacitor, or any of a variety of other types of signal isolation devices.

The isolator circuit 16 also includes a PWD correction circuit 20. The PWD correction circuit 20 is configured to adjust a timing parameter associated with the digital communication signal $SIG_{RX}$. For example, the timing parameter can correspond to pulse-width distortion that is introduced by the isolation barrier 18. Thus, the PWD correction circuit 20 can be configured to delay a rising-edge and/or a falling-edge of the digital communication signal $SIG_{RX}$. As an example, the digital communication signal $SIG_{TX}$ can be provided as a DC-balanced signal, such as in a predetermined transmission code (e.g., 8b10b). Therefore, the PWD correction circuit 20 can be configured to delay the rising-edge and/or a falling-edge of the digital communication signal $SIG_{RX}$ to restore the duty-cycle of the digital communication signal $SIG_{TX}$ to be approximately equal the duty-cycle of the digital communication signal $SIG_{TX}$ (e.g., approximately 50%).

Accordingly, the PWD correction circuit 20 can mitigate errors resulting from PWD with respect to the data receiver 14 processing the digital communication signal $SIG_{TX}$ by correcting timing parameters of the digital communication signal $SIG_{RX}$, as opposed to other circuit architectures. For example, other circuit designs that implement a different manner of pulse-width correction based on architecture choices typically do so at the expense of isolation performance, common-mode transient immunity (CMTI), immunity to RF disturbances, and/or power at higher data-rates. However, by correcting the timing parameters of the digital communication signal $SIG_{RX}$, the PWD correction circuit 20 can mitigate errors resulting from PWD without sacrificing performance or other operational aspects of the isolated communication system 10. It is to be understood that the PWD correction circuit 20 can be implemented in any circuit that can introduce PWD, and is not limited to use in an isolator circuit that introduces PWD via the isolation barrier 18.

Figure 2:
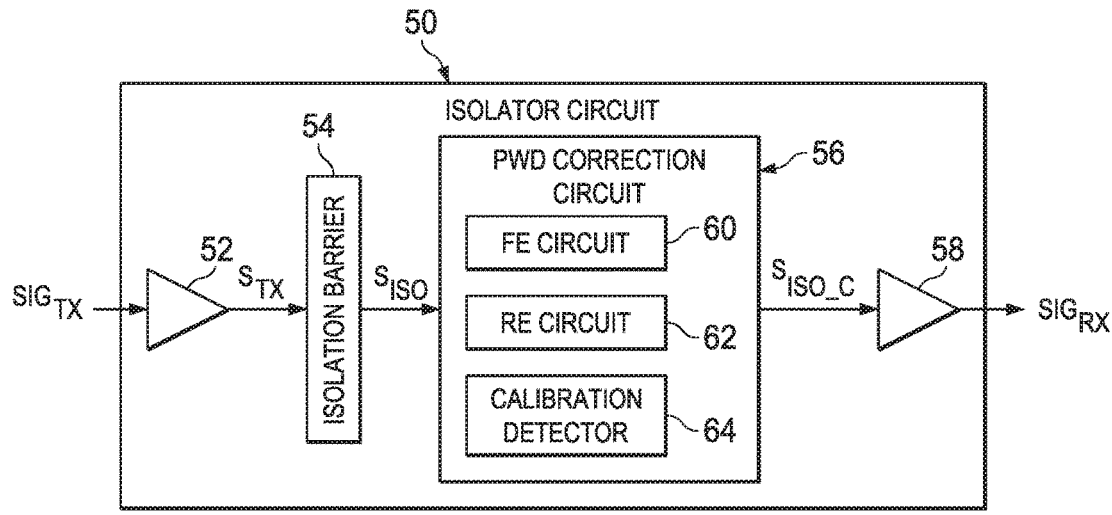
FIG. 2 illustrates an example of an isolator circuit.

FIG. 2 illustrates an example of an isolator circuit 50. The isolator circuit 50 can correspond to the isolator circuit 16 in the example of FIG. 1. Therefore, reference is to be made to the example of FIG. 1 in the following example of FIG. 2.

The isolator circuit 50 includes a first buffer 52 that is configured to receive the digital communication signal $SIG_{TX}$ and to provide a buffered digital communication signal $S_{TX}$. The buffered digital communication signal $S_{TX}$ is provided to an isolation barrier 54 that is configured to generate an isolation digital communication signal, demonstrated in the example of FIG. 2 as signal $S_{ISO}$. For example, the isolation barrier 54 can be configured as any of a variety of electrical signal isolation devices, such as a transformer or a capacitor, to provide isolation between the buffered digital communication signal $S_{TX}$ and the isolation digital communication signal $S_{ISO}$. The isolation digital communication signal $S_{ISO}$ is provided to a PWD correction circuit 56 that is configured to adjust a timing parameter associated with the isolation digital communication signal $S_{ISO}$, such as introduced by the isolation barrier 54. Therefore, the PWD correction circuit 56 generates a corrected isolation digital communication signal $S_{ISO\_C}$ that has been adjusted with respect to at least one timing parameter. The corrected isolation digital communication signal $S_{ISO\_C}$ is provided to an output buffer 58 that is configured to generate the digital communication signal $SIG_{RX}$ that is provided, for example, to the data receiver 14.

In the example of FIG. 2, the PWD correction circuit 56 includes a falling-edge delay circuit (FE CIRCUIT) 60 and a rising-edge delay circuit (RE CIRCUIT) 62. As an example, the falling-edge and rising-edge delay circuits 60 and 62 can be arranged in series with each other to generate the corrected isolation digital communication signal $S_{ISO\_C}$ to have one of a rising-edge and a falling-edge delayed relative to the isolation digital communication signal $S_{ISO}$. For example, the digital communication signal $SIG_{TX}$ can be provided as a DC-balanced signal, such as in a predetermined transmission code (e.g., 8b10b). Therefore, the corrected isolation digital communication signal $S_{ISO\_C}$ to have one of a rising-edge and a falling-edge delayed to provide the corrected isolation digital communication signal $S_{ISO\_C}$ as having an approximate 50% duty-cycle with respect to consecutive bits of opposite logic state.

In addition, the PWD correction circuit 56 includes a calibration detector 64. The calibration detector 64 is configured to detect an uncalibrated state of the PWD correction circuit 56 based on the digital communication signal $S_{ISO}$. For example, the calibration detector 64 can determine that the PWD correction circuit 56 is in the uncalibrated state at an initial activation of the isolator circuit 50, such as based on detecting a first edge-transition of the isolation digital communication signal $S_{ISO}$. The calibration detector 64 can thus wait a predetermined duration of time while the PWD correction circuit 56 calibrates before switching to a calibrated state. Additionally, the calibration detector 64 can switch from the calibrated state to the uncalibrated state in response to detecting a lack of edge-transitions of the isolation digital communication signal $S_{ISO}$ for a predetermined duration of time. During the uncalibrated state, the calibration detector 64 can be configured to provide a gated signal to the output buffer 58 instead of the corrected isolation digital communication signal $S_{ISO\_C}$.

Figure 3:
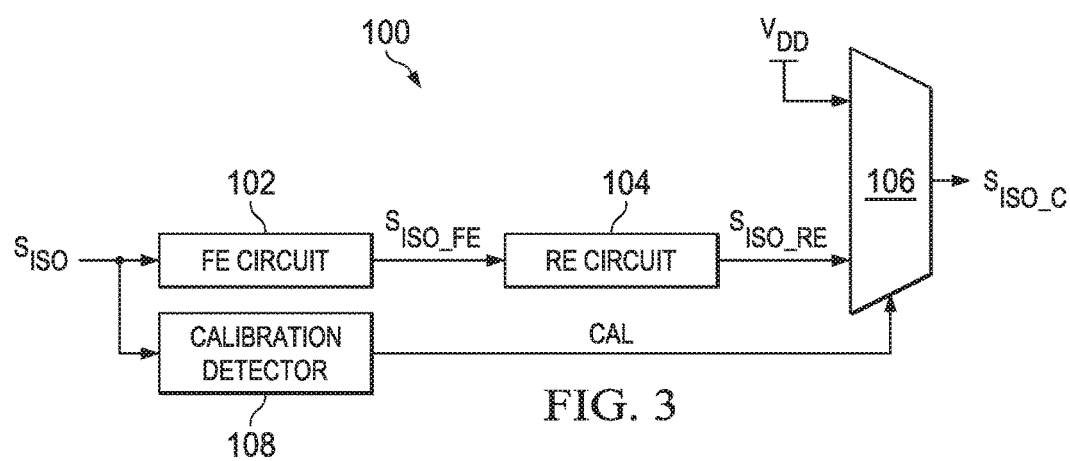
FIG. 3 illustrates an example of a pulse-width distortion correction circuit.

FIG. 3 illustrates an example of a PWD correction circuit 100. The PWD correction circuit 100 can correspond to the PWD correction circuit 20 in the example of FIG. 1 or the PWD correction circuit 56 in the example of FIG. 2, respectively. Therefore, reference is to be made to the example of FIGS. 1 and 2 in the following description of the example of FIG. 3.

The PWD correction circuit 100 includes a falling-edge delay circuit (FE CIRCUIT) 102 and a rising-edge delay circuit (RE CIRCUIT) 104 that are arranged in series. While the series arrangement of the falling-edge delay circuit 102 and the rising-edge delay circuit 104 is demonstrated as provided in the example of FIG. 3, it is to be understood that the rising-edge delay circuit 104 could be upstream of the falling-edge delay circuit 102 with respect to the isolation digital communication signal $S_{ISO}$. In the example of FIG. 3, the falling-edge delay circuit 102 receives the isolation digital communication signal $S_{ISO}$ and generates an isolation digital communication signal $S_{ISO\_FE}$ that can have a falling-edge delayed in response to detecting pulse-width distortion of the isolation digital communication signal $S_{ISO}$. Similarly, the rising-edge delay circuit 104 receives the isolation digital communication signal $S_{ISO\_FE}$ and generates an isolation digital communication signal $S_{ISO\_RE}$ that can have a rising-edge delayed in response to detecting pulse-width distortion of the isolation digital communication signal $S_{ISO\_FE}$. For example, as described previously, the digital communication signal $SIG_{TX}$ can be provided as a DC-balanced signal, and thus an approximate 50% duty-cycle with respect to consecutive bits of opposite digital state. Thus, the falling-edge delay circuit 102 and the rising-edge delay circuit 104 can cooperate to determine if the duty-cycle of the isolation digital communication signal $S_{ISO}$ has a duty-cycle that is greater than or less than 50%, and can either delay a falling-edge of the isolation digital communication signal $S_{ISO}$ (via the falling-edge delay circuit 102) in response to determining that the duty-cycle is less than 50%, or can delay a rising-edge of the isolation digital communication signal $S_{ISO}$ (via the rising-edge delay circuit 104) in response to determining that the duty-cycle is greater than 50%.

Figure 4:
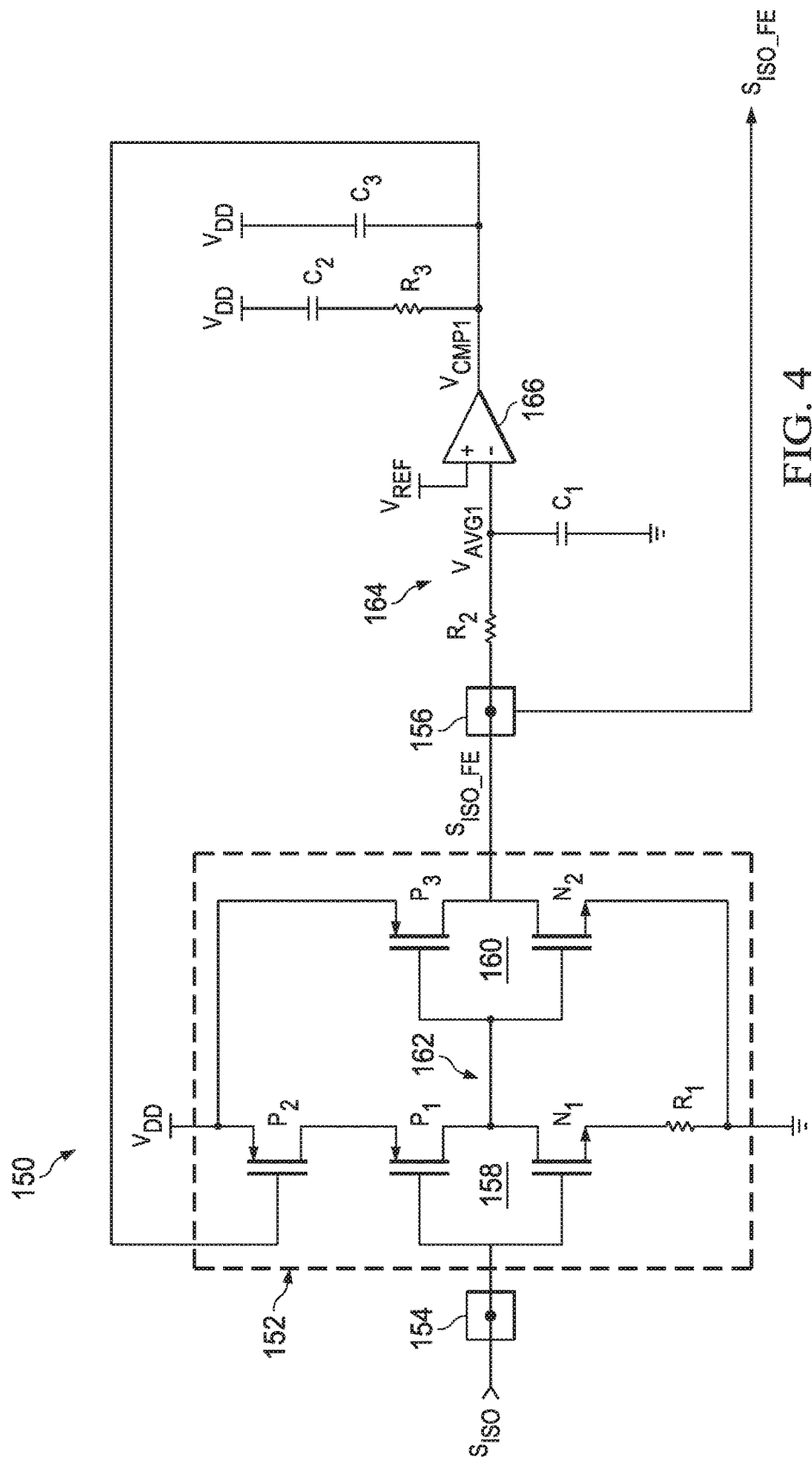
FIG. 4 illustrates an example of a falling-edge correction circuit.

FIG. 4 illustrates an example of a falling-edge correction circuit 150. The falling-edge correction circuit 150 can correspond to the falling-edge delay circuit 60 in the example of FIG. 2 or the falling-edge delay circuit 102 in the example of FIG. 3. Therefore, reference is to be made to the examples of FIGS. 1-3 in the following description of the example of FIG. 4.

The falling-edge correction circuit 150 includes a buffer 152 that is configured to receive the isolation digital communication signal $S_{ISO}$ at an input 154, and to provide the isolation digital communication signal $S_{ISO\_FE}$ at an output 156. As an example, the PWD of the isolation digital communication signal $S_{ISO}$ at the input 154 of the falling-edge correction circuit 150 can be such that the duty-cycle of the isolation digital communication signal $S_{ISO}$ with respect to consecutive opposite-state bits is less than 50%, as demonstrated in the example of FIG. 5 at 200 with the isolation digital communication signal $S_{ISO}$ having periods 202. The buffer 152 includes a first inverter stage 158 that includes an inverting transistor pair formed by a P-channel field-effect transistor (P-FET) $P_1$ and an N-channel FET (N-FET) $N_1$. The N-FET $N_1$ is separated from a low-voltage rail (e.g., ground) by a resistor $R_1$, and the P-FET $P_1$ is separated from a high-voltage rail $V_{DD}$ by a P-channel delay FET $P_2$. The buffer 152 also includes a second inverter stage 160 that includes an inverting transistor pair formed by a P-FET $P_3$ that is coupled to the high-voltage rail $V_{DD}$ and an N-FET $N_2$ that is coupled to the low-voltage rail. The second inverter stage 160 can be coupled to the first inverter stage 158 via a node 162.

Figure 5:
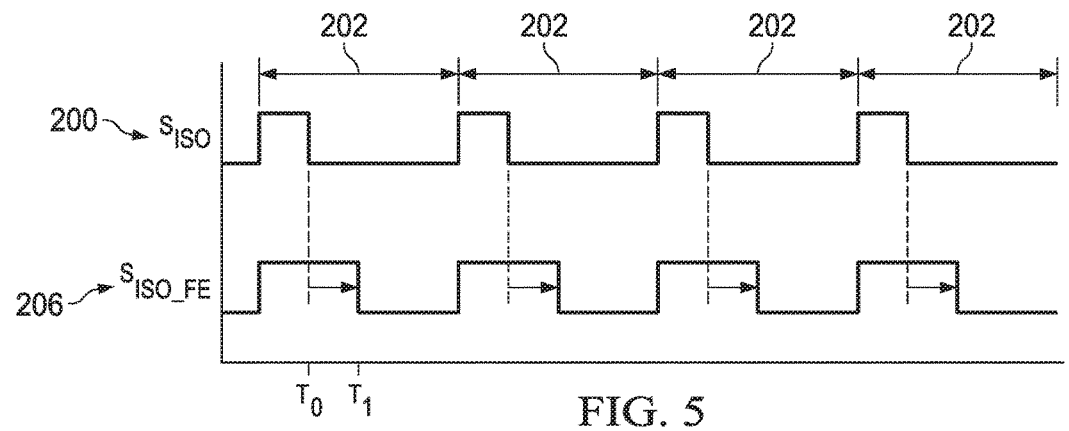
FIG. 5 illustrates an example of a timing diagram.

The isolation digital communication signal $S_{ISO\_FE}$, demonstrated in the example of FIG. 5 at 206, that is output from the buffer 152 is provided to an RC filter (or low-pass filter) that is formed by a resistor $R_2$ that is coupled the output 156 and a comparison node 164 and a capacitor $C_1$ that separates the comparison node 164 from the low-voltage rail. The RC filter can be configured to provide an average voltage $V_{AVG1}$ on the comparison node 164, such that the average voltage $V_{AVG1}$ corresponds to an average voltage amplitude of the isolation digital communication signal $S_{ISO\_FE}$. The falling-edge correction circuit 150 includes an error amplifier 166 that is configured to compare the average voltage $V_{AVG1}$ with a predetermined reference voltage $V_{REF}$. As described herein, the term "compare" with respect to the error amplifier 166 describes providing an output that is based on and/or indicative of the difference between the amplitudes of the average voltage $V_{AVG1}$ with a predetermined reference voltage $V_{REF}$. As an example, the reference voltage $V_{REF}$ can have an amplitude that is approximately equal to half the amplitude of the high-voltage rail $V_{DD}$, and thus half of a difference in amplitude of a logic-high state and a logic-low state of the isolation digital communication signal $S_{ISO\_FE}$. In the example of FIG. 4, the falling-edge correction circuit 150 also includes a series connection of a resistor $R_3$ and a capacitor $C_2$ between the output of the error amplifier 166 and the high-voltage rail $V_{DD}$, which is in parallel with a capacitor $C_3$. The resistor $R_3$ and the capacitors $C_2$ and $C_3$ cooperate to stabilize the output of the error amplifier 166.

In response to the comparison of the average voltage $V_{AVG1}$ and the reference voltage $V_{REF}$, the error amplifier 166 is configured to generate a comparison voltage $V_{CMP1}$ having an amplitude that is based on and/or indicative of the difference between a predetermined reference voltage $V_{REF}$ and the average voltage $V_{AVG1}$. The comparison voltage $V_{CMP1}$ is provided to a gate of the delay FET $P_2$ to control the delay FET $P_2$ (e.g., to control the maximum current provided by delay FET $P_2$ when P-FET $P_1$ is activated). Therefore, the error amplifier 166 is arranged in a negative feedback arrangement with respect to the first inverter stage 158 of the buffer 152. In response to the isolation digital communication signal $S_{ISO}$ switching to a logic-low state, as demonstrated at a time $T_0$ in the example of FIG. 5, the P-FET $P_1$ may be activated. The maximum amount of current provided by the delay FET $P_2$ may be determined at least in part by $V_{CMP1}$. Despite the activation of the P-FET $P_1$, the limited maximum current provided by the delay FET $P_2$ may result in a smaller amount of current being provided to the node 162 relative to the amount of current sunk by N-FET $N_1$ when N-FET $N_1$ is activated. The smaller amount of current sourced into the node 162 may cause the voltage at the node 162 to increase more slowly for low-to-high transitions than the rate at which the voltage at node 162 decreases during high-to-low transitions. This may in turn delay the triggering of the high-to-low transitions for the voltage at the output 156 ($S_{ISO\_FE}$) relative to the triggering of the low-to-high transitions at the output 156, thereby delaying the falling edge of the isolation digital communication signal $S_{ISO\_FE}$ at the output 156 relative to the rising-edge.

When the duty-cycle at the input 154 is less than the target duty-cycle, falling-edge correction circuit 150 may be configured to delay the falling-edge of the input signal to achieve a target duty-cycle of the signal at the output 156. For example, if the duty-cycle at the input 154 is less than the target duty-cycle, $V_{AVG1}$ will initially be decreased relative to its steady-state value, thereby causing $V_{CMP1}$ to increase. The increase in $V_{CMP1}$ may decrease the maximum amount of current provided by delay FET $P_2$, thereby decreasing the rate of the low-to-high transitions at node 162. Decreasing the rate of the low-to-high transitions at node 162 may increase the delay in triggering the high-to-low transitions for the voltage at the 156, thereby increasing the delay of the falling-edge of the output voltage ($S_{ISO\_FE}$) at the output 156. Increasing the delay of the falling-edge may cause the duty-cycle to increase to the target duty-cycle, thereby causing $V_{AVG1}$ to increase to a value corresponding to the target duty-cycle. The predetermined or target duty-cycle may, in some examples, be programmed by adjusting $V_{REF}$ (e.g., $V_{REF}$ may be approximately equal to the target duty-cycle).

When the duty-cycle at the input 154 is greater than the target duty-cycle, $V_{AVG1}$ will increase, thereby causing $V_{CMP1}$ to decrease. The decrease in $V_{CMP1}$ may cause the maximum amount of current provided by delay FET $P_2$ to increase to a level where there is virtually no delay (or a minimum amount of delay) in the falling-edge. As such, when the duty-cycle at the input 154 is greater than the target duty-cycle, falling-edge correction circuit 150 may pass the input signal to the output with virtually no delay in the falling-edge of the signal.

Figure 6:
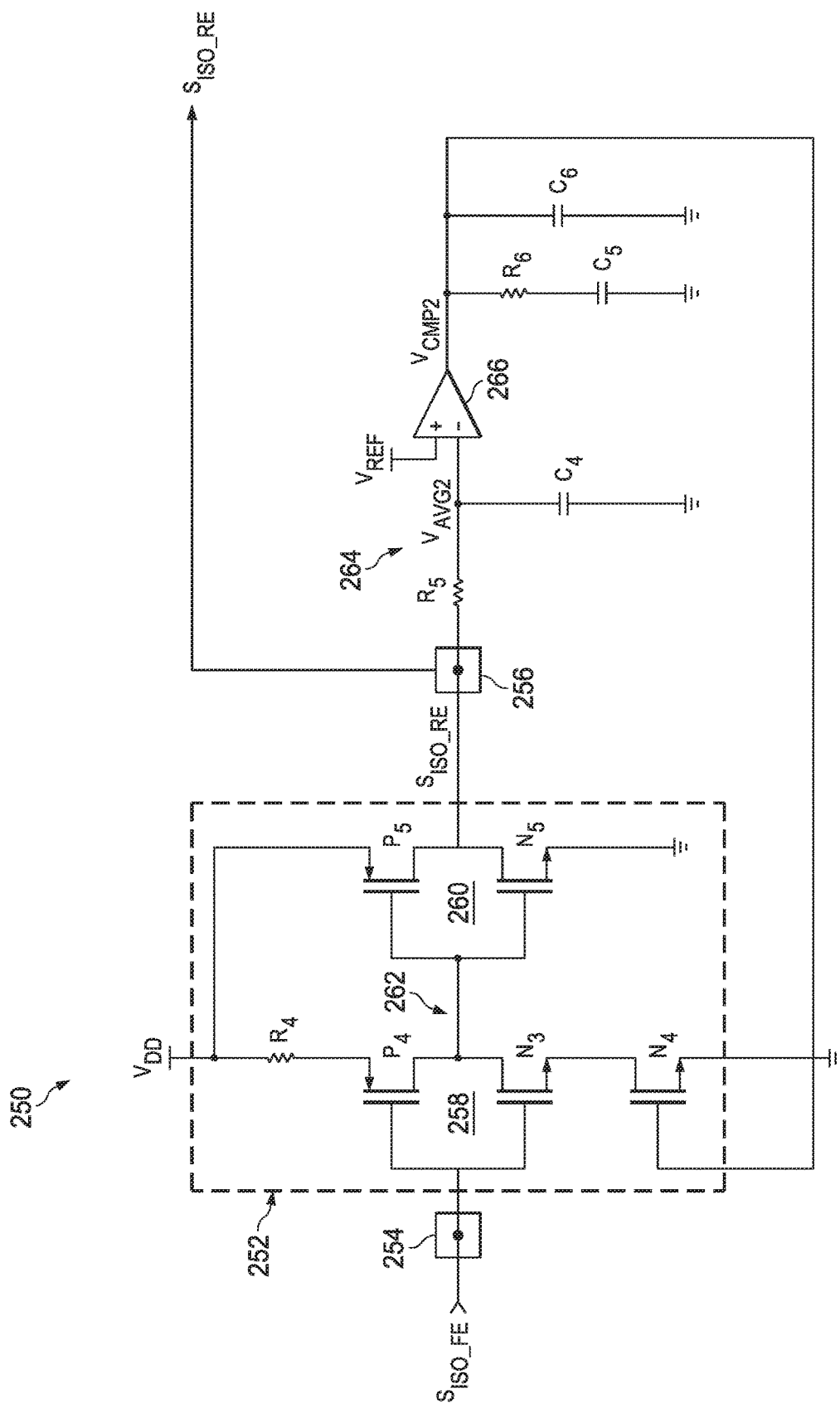
FIG. 6 illustrates an example of a rising-edge correction circuit.

FIG. 6 illustrates an example of a rising-edge correction circuit 250. The rising-edge correction circuit 250 can correspond to the rising-edge delay circuit 62 in the example of FIG. 2 or the rising-edge delay circuit 104 in the example of FIG. 3. Therefore, reference is to be made to the examples of FIGS. 1-4 in the following description of the example of FIG. 6.

The rising-edge correction circuit 250 includes a buffer 252 that is configured to receive the isolation digital communication signal $S_{ISO\_FE}$ at an input 254, and to provide the isolation digital communication signal $S_{ISO\_RE}$ at an output 256. As an example, the PWD of the isolation digital communication signal $S_{ISO}$, demonstrated in the example of FIG. 7 at 300 with the isolation digital communication signal $S_{ISO}$ having periods 302, at the input 154 of the falling-edge correction circuit 150 can be such that the duty-cycle of the isolation digital communication signal $S_{ISO}$ with respect to consecutive opposite-state bits is greater than 50%. As a result, the average voltage $V_{AVG1}$ in the falling-edge correction circuit 150 is consistently greater than the reference voltage $V_{REF}$. Therefore, the falling-edge correction circuit 150 may provide no timing adjustments to the isolation digital communication signal $S_{ISO}$, and thus provides the isolation digital communication signal $S_{ISO\_FE}$, demonstrated in the example of FIG. 7 at 304, to the rising-edge correction circuit 250 without timing adjustments, such that the isolation digital communication signal $S_{ISO\_FE}$ is substantially the same as the isolation digital communication signal $S_{ISO}$. In other words, if the input signal to the falling-edge correction circuit 150 has a duty-cycle greater than the target duty-cycle (e.g., 50%), the falling-edge correction circuit 150 may pass the input signal through to the output without substantially delaying the falling-edge of the signal. The buffer 252 includes a first inverter stage 258 that includes an inverting transistor pair formed by a P-FET $P_4$ and an N-FET $N_3$. The N-FET $N_3$ is separated from a low-voltage rail (e.g., ground) by an N-channel delay FET $N_4$, and the P-FET $P_4$ is separated from a high-voltage rail $V_{DD}$ by a resistor $R_4$. The buffer 252 also includes a second inverter stage 260 that includes an inverting transistor pair formed by a P-FET $P_5$ that is coupled to the high-voltage rail $V_{DD}$ and an N-FET $N_5$ that is coupled to the low-voltage rail. The second inverter stage 260 can be separated from the first inverter stage 258 by a node 262.

Figure 7:
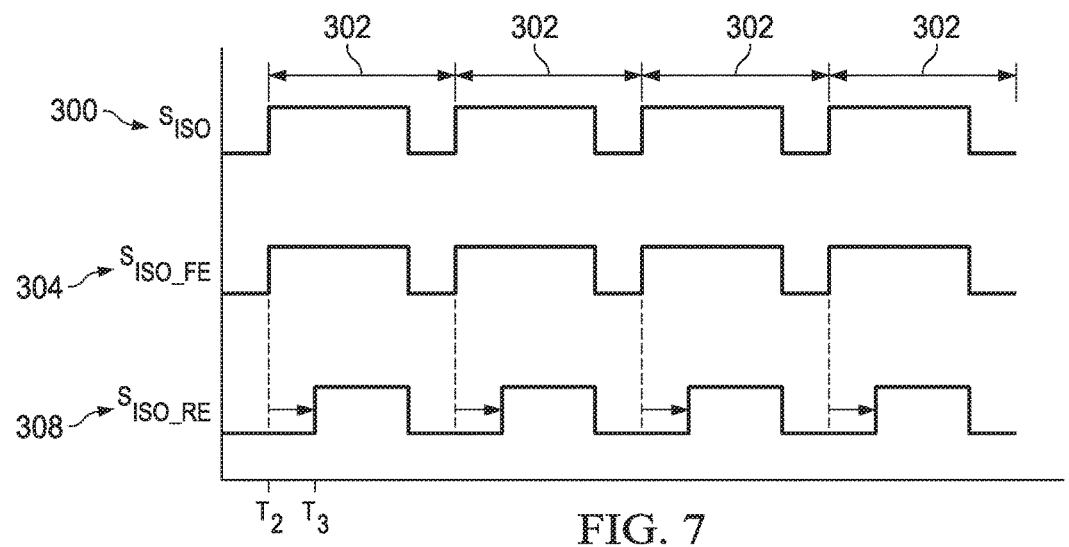
FIG. 7 illustrates another example of a timing diagram

The isolation digital communication signal $S_{ISO\_RE}$, demonstrated in the example of FIG. 7 at 308, that is output from the buffer 252 is provided to an RC filter that is formed by a resistor $R_5$ that separates the output 256 from a comparison node 264 and a capacitor $C_4$ that separates the comparison node 264 from the low-voltage rail. The RC filter can be configured to provide an average voltage $V_{AVG2}$ on the comparison node 264, such that the average voltage $V_{AVG2}$ corresponds to an average voltage amplitude of the isolation digital communication signal $S_{ISO\_RE}$. The rising-edge correction circuit 250 includes an error amplifier 266 that is configured to compare the average voltage $V_{AVG2}$ with a predetermined reference voltage $V_{REF}$. As described herein, the term "compare" with respect to the error amplifier 266 describes providing an output that is based on the difference between the amplitudes of the average voltage $V_{AVG2}$ with a predetermined reference voltage $V_{REF}$. For example, the predetermined reference voltage $V_{REF}$ can be the same reference voltage as the reference voltage $V_{REF}$ in the falling-edge correction circuit 150. Therefore, the reference voltage $V_{REF}$ can have an amplitude that is approximately equal to an average of the logic-high and logic-low voltage amplitudes (or a duty-cycle) of the isolation digital communication signal $S_{ISO\_RE}$. In the example of FIG. 6, the rising-edge correction circuit 250 also includes a series connection of a resistor $R_6$ and a capacitor $C_5$ between the output of the error amplifier 266 and the low-voltage rail, which is in parallel with a capacitor $C_6$. The resistor $R_6$ and the capacitors $C_5$ and $C_6$ cooperate to stabilize the output of the error amplifier 266.

In response to the comparison of the average voltage $V_{AVG2}$ and the reference voltage $V_{REF}$, the error amplifier 266 is configured to generate a comparison voltage $V_{CMP2}$ that is based on and/or indicative of the difference in amplitude between a predetermined reference voltage $V_{REF}$ and the average voltage $V_{AVG2}$. The comparison voltage $V_{CMP2}$ is provided to a gate of the delay FET $N_4$ to control the delay FET $N_4$. Therefore, the error amplifier 266 is arranged in a negative feedback arrangement with respect to the first inverter stage 258 of the buffer 252. In response to the isolation digital communication signal $S_{ISO\_FE}$ switching to a logic-high state, as demonstrated at a time $T_2$ in the example of FIG. 7, the N-FET $N_3$ may be activated. The maximum amount of current provided by delay FET $N_4$ may be determined at least in part by $V_{CMP2}$. Despite the activation of the N-FET $N_3$, the limited maximum current provided by the delay FET $N_4$ may result in a smaller amount of current being sunk from node 262 relative to the amount of current sourced by P-FET $P_4$ when P-FET $P_4$ is activated. The smaller amount of current sunk from the node 262 may cause the voltage at the node 262 to decrease more slowly for high-to-low transitions than the rate at which the voltage at node 262 increases during low-to-high transitions. This may in turn delay the triggering of the low-to-high transitions for the voltage at the output 256 ($S_{ISO\_RE}$) relative to the triggering of the high-to-low transitions at the output 256, thereby delaying the rising-edge of the isolation digital communication signal $S_{ISO\_RE}$ at the output 256 relative to the falling-edge.

When the duty-cycle at the input 254 is greater than the target duty-cycle, rising-edge correction circuit 250 may be configured to delay the rising-edge of the input signal to achieve a target duty-cycle of the signal at the output 256. For example, if the duty-cycle at the input 254 is greater than the target duty-cycle, $V_{AVG2}$ will initially be increased relative to its steady-state value, thereby causing $V_{CMP2}$ to decrease. The decrease in $V_{CMP2}$ may decrease the maximum amount of current provided by delay FET $N_4$, thereby decreasing the rate of the high-to-low transitions at node 262. Decreasing the rate of the high-to-low transitions at node 262 may increase the delay in triggering the low-to-high transitions for the voltage at the output 256, thereby increasing the delay of the rising-edge of the output voltage ($S_{ISO\_RE}$) at node 256. Increasing the delay of the rising-edge may cause the duty-cycle to decrease to the target duty-cycle, thereby decreasing $V_{AVG2}$ to a value that corresponds to the target duty-cycle. The predetermined or target duty-cycle may, in some examples, be programmed by adjusting $V_{REF}$ (e.g., $V_{REF}$ may be approximately equal to the target duty-cycle).

When the duty-cycle at the input 254 is less than the target duty-cycle, $V_{AVG2}$ will decrease, thereby causing $V_{CMP2}$ to increase. The increase in $V_{CMP2}$ may cause the maximum amount of current provided by delay FET $N_4$ to increase to a level where there is virtually no delay (or a minimum amount of delay) in the rising-edge. As such, when the duty-cycle at the input 254 is less than the target duty-cycle, rising-edge correction circuit 150 may pass the input signal to the output with virtually no delay in the rising-edge of the signal.

Referring back to the example of FIG. 3, the isolation digital communication signal $S_{ISO\_RE}$ is provided to a first input of a multiplexer 106 that also receives the high-voltage rail $V_{DD}$ at a second input. The multiplexer 106 is therefore configured to provide an output signal $S_{ISO\_C}$ as one of a corrected digital communication signal corresponding to the isolation digital communication signal $S_{ISO\_RE}$, or as a gated signal corresponding to the high-voltage rail $V_{DD}$. In the example of FIG. 3, the PWD correction circuit 100 includes a calibration detector 108 that is configured to detect an uncalibrated state of the falling-edge delay circuit 102 and/or the rising-edge correction circuit 104 based on the digital communication signal $S_{ISO}$. For example, the calibration detector 108 can determine that the falling-edge delay circuit 102 and/or the rising-edge delay circuit 104 are in the uncalibrated state at an initial activation of the isolator circuit 50, such as based on detecting a first edge-transition of the isolation digital communication signal $S_{ISO}$. The calibration circuit 108 can thus wait a predetermined duration of time while the falling-edge delay circuit 102 and/or the rising-edge delay circuit 104 calibrate before switching to a calibrated state. Additionally, the calibration circuit 108 can switch from the calibrated state to the uncalibrated state in response to detecting a lack of edge-transitions of the isolation digital communication signal $S_{ISO}$ for a predetermined duration of time. In the example of FIG. 3, the calibration detector 108 is configured to provide a calibration signal CAL that is provided to the multiplexer 106 to select the input of the multiplexer 106. Therefore, during the uncalibrated state, the multiplexer 106 can be selected via a first state of the calibration signal CAL to provide the gated signal corresponding to high-voltage rail $V_{DD}$ as the signal $S_{ISO\_C}$, and can be selected via a second state of the calibration signal CAL to provide the isolation digital communication signal $S_{ISO\_RE}$ as the corrected isolation digital communication signal $S_{ISO\_C}$.

The calibration detector 108 thus provides a manner of allowing transitions of operation of the isolated communication system 10. As an example, the calibration detector 108 can allow for minimal changes to operation of the isolated communication system 10 during activation and deactivation of the isolated communication system 10, power loss, or other occurrences that may result in interruption of the digital communication signal $SIG_{TX}$. Thus, the calibration detector 108, as described herein, can allow for minimal interruption of the operation of the PWD correction circuit 100 in response to interruption of the digital communication signal $SIG_{TX}$, and thus the digital communication signal $S_{ISO}$.

Figure 8:
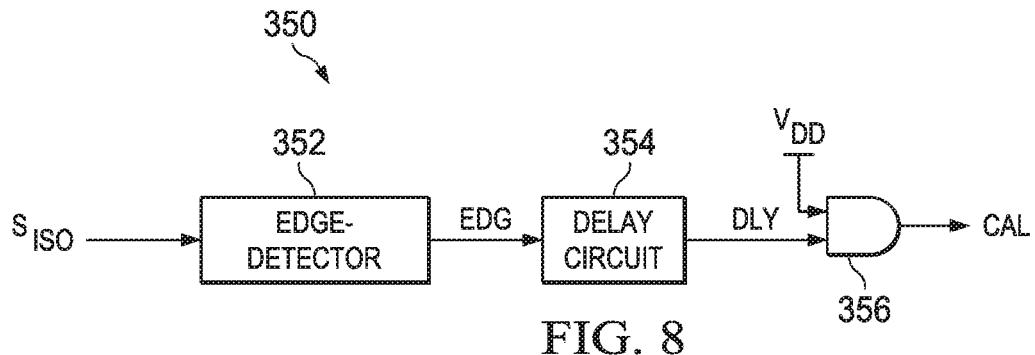
FIG. 8 illustrates an example of a calibration circuit.

FIG. 8 illustrates an example of a calibration circuit 350. The calibration circuit 350 can correspond to the calibration circuit 108 in the example of FIG. 3. Therefore, reference is to be made to the example of FIG. 3 in the following description of the example of FIG. 8.

The calibration circuit 350 includes an edge-detector 352 that is configured to detect an edge-transition of the digital communication signal $S_{ISO}$. As an example, the edge-detector 352 can correspond to a frequency detector that is tuned to detect frequencies greater than a predetermined frequency (e.g., 200 nanoseconds) to detect the edge-transition of the digital communication signal $S_{ISO}$. In response to detecting the edge-transition of the digital communication signal $S_{ISO}$, the edge-detector 352 can generate an edge-detection signal EDG that corresponds to detection of the edge-transition of the digital communication signal $S_{ISO}$. Particularly, the edge-detector 352 indicates via the edge-detection signal EDG that data is being provided in the digital communication signal $S_{ISO}$, which can indicate that calibration of the PWD correction circuit 100 (e.g., the falling-edge delay circuit 102 and the rising-edge correction circuit 104) is to begin. For example, the calibration can be initiated with respect to the RC filter in the falling-edge delay circuit 150 formed by the resistor $R_2$ and the capacitor $C_1$ and the RC filter in the rising-edge correction circuit 250 formed by the resistor $R_5$ and the capacitor $C_4$, as well as the stabilization circuit elements at the outputs of the respective error amplifiers 166 and 266. The edge-detection signal EDG can also be de-asserted in response to the edge-detector 352 determining that no edge-transition has been detected in the digital communication signal $S_{ISO}$ over a predetermined duration of time, which can thus be indicative of data no longer being provided (e.g., the digital communication signal $SIG_{TX}$ no longer being provided) from the data transmitter 12.

The edge-detection signal EDG is provided to a delay circuit 354 that is configured to generate an activation signal DLY in response to the edge-detection signal EDG. As an example, the activation signal DLY can be provided as a logic-high signal in response to the edge-detection signal EDG indicating an edge-transition of the digital communication signal $S_{ISO}$, and can be provided as a logic-low signal in response to the edge-detection signal EDG indicating that data is no longer being provided via the digital communication signal $S_{ISO}$. For example, the delay circuit 354 can be configured to delay assertion of the activation signal DLY in response to assertion of the edge-detection signal EDG by a predetermined duration of time (e.g., 250 microseconds). The delay circuit 354 can also be configured to provide de-assertion of the activation signal DLY substantially instantaneously in response to de-assertion of the edge-detection signal EDG.

The activation signal DLY is provided as a first input to an AND-gate 356, with the high-voltage rail $V_{DD}$ being provided to a second input of the AND-gate 356. Therefore, in response to assertion of the activation signal DLY, the AND-gate 356 can assert the calibration signal CAL that can switch the input of the multiplexer 106 from the high-voltage rail $V_{DD}$ to the isolation digital communication signal $S_{ISO\_RE}$. Therefore, the predetermined delay of the assertion of the activation signal DLY, and thus the calibration signal CAL, can be sufficient to allow calibration of the PWD correction circuit 100 before the multiplexer 106 provides the output signal $S_{ISO\_C}$ as the isolation digital communication signal $S_{ISO\_RE}$. On the other hand, in response to the edge detector 352 detecting no edge-transition, and thus an uncalibrated state, the edge detector 352 can de-assert the edge-detection signal EDG, which can result in substantially instantaneous de-assertion of the activation signal DLY. Accordingly, the calibration signal CAL can be de-asserted to switch the input of the multiplexer 106 from the isolation digital communication signal $S_{ISO\_RE}$ to the high-voltage rail $V_{DD}$ to provide the output signal $S_{ISO\_C}$ as a gated signal.

Figure 9:
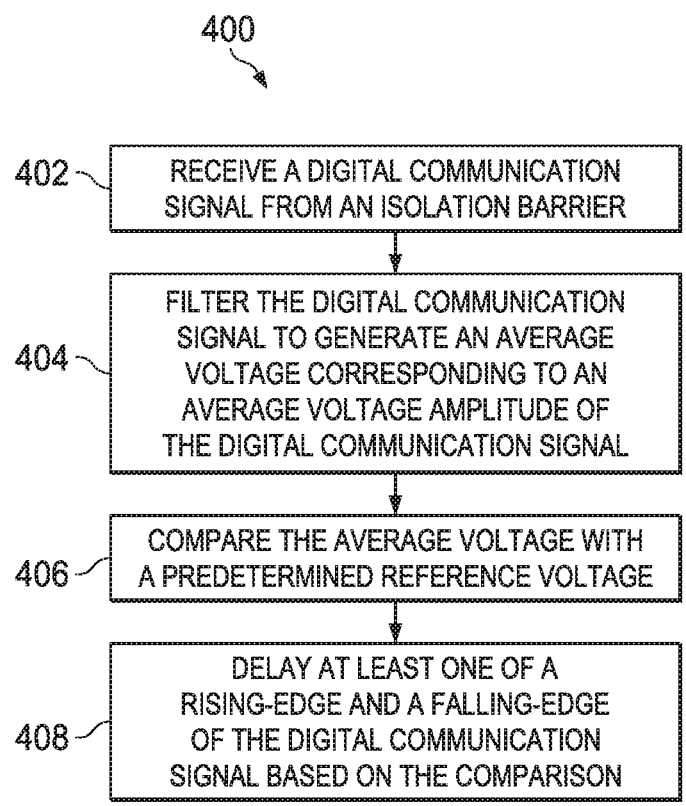
FIG. 9 illustrates an example of a method for correcting pulse-width distortion in an isolated communication system.

In view of the foregoing structural and functional features described above, a methodology in accordance with various aspects of the present invention will be better appreciated with reference to FIG. 9. While, for purposes of simplicity of explanation, the methodology of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 9 illustrates an example of a method 400 for correcting pulse-width distortion in an isolated communication system (e.g., the isolated communication system 10). At 402, a digital communication signal (e.g., the digital communication signal $S_{ISO}$) is received from an isolation barrier. At 404, the digital communication signal is filtered to generate an average voltage (e.g., the average voltage $V_{AVG1}$ or $V_{AVG2}$) corresponding to an average voltage amplitude of the digital communication signal. At 406, the average voltage is compared with a predetermined reference voltage (e.g., the predetermined reference voltage $V_{REF}$). At 408, at least one of a rising-edge and a falling-edge of the digital communication signal is delayed based on the comparison.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A communication system comprising:
   a data transmitter configured to generate a digital communication signal;
   a data receiver configured to receive the digital communication signal; and
   a pulse-width distortion (PWD) correction circuit arranged between the data transmitter and the data receiver and being configured to adjust at least one timing parameter associated with the digital communication signal;
   wherein the PWD correction circuit comprises at least one edge-delay circuit, each of the at least one edge-delay circuit comprising:
   a buffer configured to generate a buffered digital communication signal based on the digital communication signal, the buffer comprising an inverter stage configured to invert the digital communication signal;
   a filter configured to generate an average voltage corresponding to an average amplitude of the buffered digital communication signal; and
   an error amplifier configured to compare the average voltage with a predetermined reference voltage to generate a comparison signal that controls the inverter stage of the buffer in a negative feedback arrangement.

2. The system of claim 1, wherein the inverter stage comprises a delay transistor interconnecting one transistor of an inverting transistor pair and a respective one of a high-voltage rail and a low-voltage rail, the delay transistor being controlled by the comparison signal to delay a respective one of a rising-edge and a falling-edge of the buffered digital communication signal.

3. The system of claim 2, wherein the at least one edge-delay circuit comprises a rising-edge delay circuit configured to delay the rising-edge of the buffered digital communication signal and a falling edge-delay circuit configured to delay a falling-edge of the buffered digital communication signal.

4. The system of claim 1, wherein the predetermined reference voltage has an amplitude equal to approximately half an amplitude of the digital communication signal in a logic-high state.

5. A communication system comprising:
   a data transmitter configured to generate a digital communication signal;
   a data receiver configured to receive the digital communication signal; and
   a pulse-width distortion (PWD) correction circuit arranged between the data transmitter and the data receiver and being configured to adjust at least one timing parameter associated with the digital communication signal;
   wherein the PWD correction circuit further comprises a calibration detector configured to detect an uncalibrated state of the PWD correction circuit based on the digital communication signal and to provide a gated signal to the data receiver instead of the digital communication signal in response to detecting the uncalibrated state of the PWD correction circuit.

6. The system of claim 5, wherein the calibration detector comprises:
   an edge-detector configured to detect an edge-transition associated with the digital communication signal; and
   a delay circuit configured to activate a calibration signal, the calibration signal being configured to switch a multiplexer from a first input associated with a gating signal to a second input associated with the digital communication signal in response to the edge-detector detecting the edge-transition.

7. A method for correcting pulse-width distortion (PWD) in an isolated communication system, the method comprising:
   receiving a digital communication signal from an isolation barrier;
   filtering the digital communication signal to generate an average voltage corresponding to an average voltage amplitude of the digital communication signal;
   comparing the average voltage with a predetermined reference voltage; and
   delaying at least one of a rising-edge and a falling-edge of the digital communication signal based on the comparison.

8. The method of claim 7, wherein the digital communication signal is configured as a DC-balanced digital communication signal.

9. The method of claim 7, further comprising:
   detecting an uncalibrated state of the PWD correction circuit based on the digital communication signal; and
   providing a gated signal to a data receiver instead of the digital communication signal in response to detecting the uncalibrated state of the PWD correction circuit.

10. The method of claim 9, wherein detecting the uncalibrated state comprises detecting an edge-transition associated with the digital communication signal, and wherein providing the gated signal comprises activating a calibration signal to switch a multiplexer from a first input associated with the gating signal to a second input associated with the digital communication signal comprising the delayed at least one of the rising-edge and the falling-edge in response to detecting the edge-transition.

11. The method of claim 7, wherein delaying the at least one of the rising-edge and the falling-edge comprises:
   generating a comparison signal in response to the comparison of the average voltage with the predetermined reference voltage; and
   controlling a delay transistor interconnecting one transistor of an inverting transistor pair and a respective one of a high-voltage rail and a low-voltage rail via the comparison signal, the inverting transistor pair being associated with an inverter stage of a buffer configured to generate a buffered digital communication signal based on the digital communication signal, such that the delay transistor delays the respective one of a rising-edge and a falling-edge of the buffered digital communication signal based on the comparison signal.

12. An isolator circuit interconnecting a data transmitter and a data receiver, the isolator circuit comprising:
   an isolation barrier configured to provide isolation of a DC-balanced digital communication signal that is transmitted from the data transmitter to the data receiver; and
   a pulse-width distortion (PWD) correction circuit arranged between the barrier and the data receiver and being configured to adjust at least one timing parameter associated with the DC-balanced digital communication signal;
   wherein the PWD correction circuit comprises at least one edge-delay circuit, each of the at least one edge-delay circuit comprising:
   a buffer configured to generate a buffered digital communication signal based on the DC-balanced digital communication signal, the buffer comprising an inverter stage configured to invert the DC-balanced digital communication signal;
   a filter configured to generate an average voltage corresponding to an average amplitude of the buffered digital communication signal; and
   an error amplifier configured to compare the average voltage with a predetermined reference voltage to generate a comparison signal that controls the inverter stage of the buffer in a negative feedback arrangement.

13. The system of claim 12, wherein the inverter stage comprises a delay transistor interconnecting one transistor of an inverting transistor pair and a respective one of a high-voltage rail and a low-voltage rail, the delay transistor being controlled by the comparison signal to delay a respective one of a rising-edge and a falling-edge of the buffered digital communication signal.

14. The system of claim 12, wherein the PWD correction circuit further comprises a calibration detector configured to detect an uncalibrated state of the PWD correction circuit based on the DC-balanced digital communication signal and to provide a gated signal to the data receiver instead of the digital communication signal in response to detecting the uncalibrated state of the PWD correction circuit.

15. The system of claim 14, wherein the calibration detector comprises:
   an edge-detector configured to detect an edge-transition associated with the DC-balanced digital communication signal; and
   a delay circuit configured to activate a calibration signal, the calibration signal being configured to switch a multiplexer from a first input associated with a gating signal to a second input associated with the digital communication signal in response to the edge-detector detecting the edge-transition.

* * * * *